(12) United States Patent
Kagami et al.

(10) Patent No.: US 10,295,610 B2
(45) Date of Patent: May 21, 2019

(54) ELECTRIC POWER STORAGE SYSTEM FOR A VEHICLE AND METHOD FOR CONTROLLING ELECTRIC POWER STORAGE SYSTEM FOR A VEHICLE

(71) Applicant: TOYOTA JIDOSHA KABUSHIKI KAISHA, Toyota-shi, Aichi-ken (JP)

(72) Inventors: Masahiro Kagami, Nagoya (JP); Takuro Hayashi, Kariya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 341 days.

(21) Appl. No.: 15/119,231

(22) PCT Filed: Feb. 16, 2015

(86) PCT No.: PCT/IB2015/000162
§ 371 (c)(1),
(2) Date: Aug. 16, 2016

(87) PCT Pub. No.: WO2015/124986
PCT Pub. Date: Aug. 27, 2015

(65) Prior Publication Data
US 2017/0010332 A1     Jan. 12, 2017

(30) Foreign Application Priority Data

Feb. 18, 2014   (JP) .................. 2014-028470

(51) Int. Cl.
*G01R 31/36*  (2019.01)
*G01R 31/392* (2019.01)
(Continued)

(52) U.S. Cl.
CPC ........ *G01R 31/392* (2019.01); *B60L 11/1851* (2013.01); *B60L 11/1857* (2013.01);
(Continued)

(58) Field of Classification Search
CPC .............. B60L 11/1851; B60L 11/1857; B60L 11/1861; B60L 2240/545; B60L 2260/56; G01R 31/3675; G01R 31/3679
See application file for complete search history.

(56) References Cited

U.S. PATENT DOCUMENTS 7,742,885 B2 *  6/2010  Oohasi .................. B60L 3/0038
                                                           320/137
8,937,452 B2 *  1/2015  Schwarz ............... H01M 10/42
                                                           320/104
(Continued)

FOREIGN PATENT DOCUMENTS

CN         103339785 A      10/2013
DE      102012001820 A1      8/2012
(Continued)

OTHER PUBLICATIONS

International Search Report and Written Opinion for PCT/162015/000162 dated Jun. 10, 2015.
(Continued)

*Primary Examiner* — Vinh P Nguyen
(74) *Attorney, Agent, or Firm* — Sughrue Mion, PLLC

(57) ABSTRACT

An electric power storage system for a vehicle includes an electric power storage device, a temperature sensor, and a controller. The vehicle includes an ignition switch. The electric power storage device is mounted on the vehicle. The temperature sensor is configured to detect a temperature of the electric power storage device. The controller is configured to estimate a rest temperature of the electric power storage device at a time when the ignition switch is OFF. The controller is configured to acquire the temperature of the electric power storage device at a time when the ignition switch is ON by using the temperature sensor when the ignition switch is turned ON. The controller is configured to estimate the rest temperature by using an average value of at (Continued)

least two of a plurality of the temperatures acquired during a predetermined period. The plurality of temperatures are the temperatures of the electric power storage device which are acquired at a time when the ignition switch is turned ON during the predetermined period.

9 Claims, 8 Drawing Sheets

(51) Int. Cl.
  *G01R 31/374* (2019.01)
  *B60L 11/18* (2006.01)
(52) U.S. Cl.
  CPC ........ *B60L 11/1861* (2013.01); *G01R 31/374* (2019.01); *B60L 2240/545* (2013.01); *B60L 2260/56* (2013.01); *Y02T 10/705* (2013.01); *Y02T 10/7005* (2013.01); *Y02T 10/7044* (2013.01)

(56) References Cited

U.S. PATENT DOCUMENTS

| | | | |
|---|---|---|---|
| 9,263,909 B2* | 2/2016 | Obata | H01M 10/44 |
| 9,272,635 B2* | 3/2016 | Izumi | B60L 11/1861 |
| 9,678,167 B2* | 6/2017 | Goto | G01R 31/3679 |
| 9,849,793 B2* | 12/2017 | Tashiro | H02J 7/0029 |
| 2010/0019729 A1 | 1/2010 | Kaita et al. | |
| 2012/0001746 A1 | 1/2012 | Kamiya | |
| 2012/0200257 A1 | 8/2012 | Schwarz et al. | |
| 2013/0294479 A1 | 11/2013 | Ichikawa | |

FOREIGN PATENT DOCUMENTS

| | | |
|---|---|---|
| EP | 2482376 A1 | 8/2012 |
| EP | 2669987 A1 | 12/2013 |
| JP | 10-142302 A | 5/1998 |
| JP | 2010-035280 A | 2/2010 |
| JP | 2012-016192 A | 1/2012 |
| JP | 2012-253975 A | 12/2012 |
| JP | 2014-187808 A | 10/2014 |
| WO | 2012/101667 A1 | 8/2012 |

OTHER PUBLICATIONS

Anonymous: "Mittelwert—Wikipedia", Sep. 3, 2011, Internet, Retrieved from the Internet: URL: http://de.wikipedia.org/wiki/Mittelwert#Winsorisiertes oder gestutztes Mittel [retrieved on May 29, 2015].

* cited by examiner

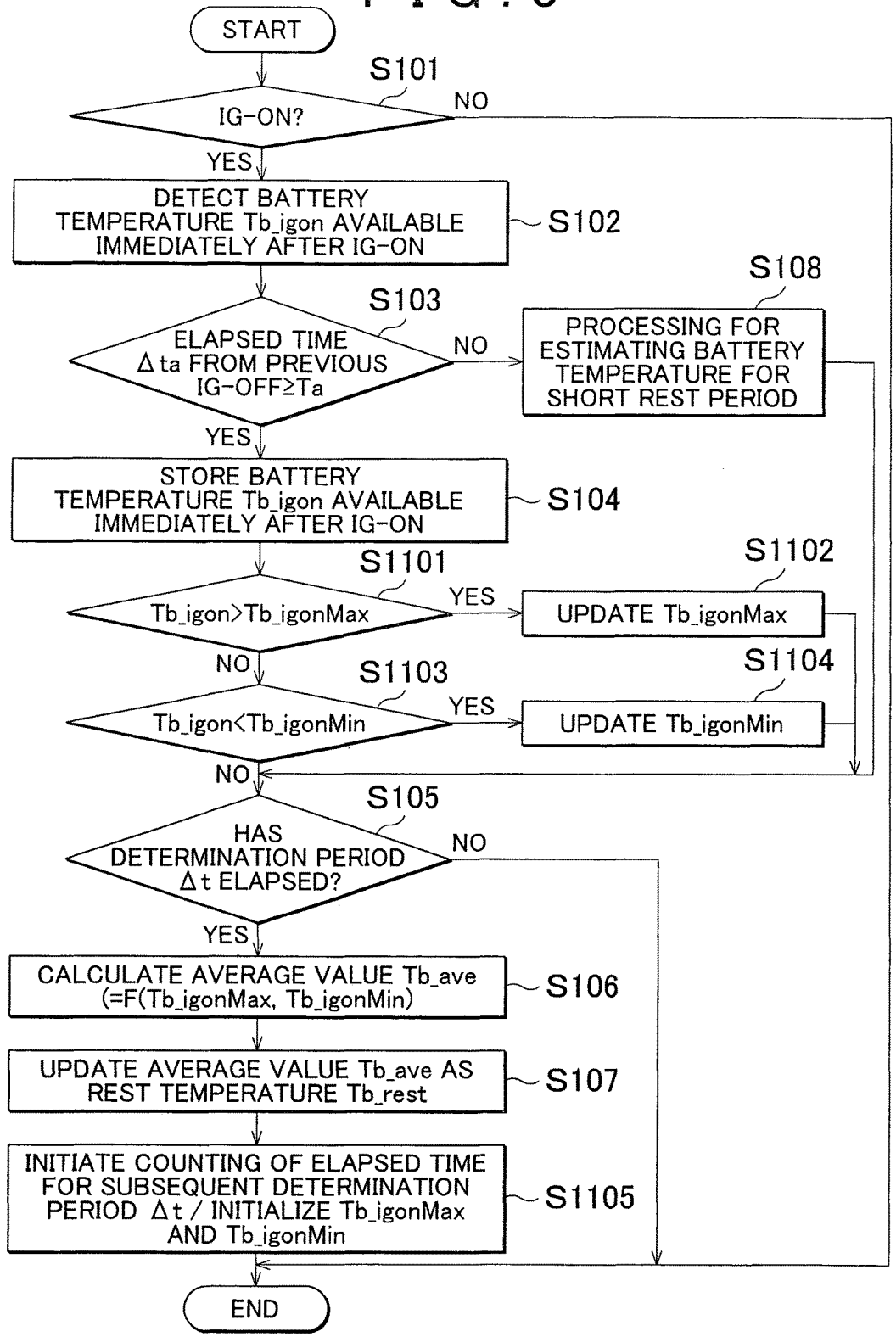

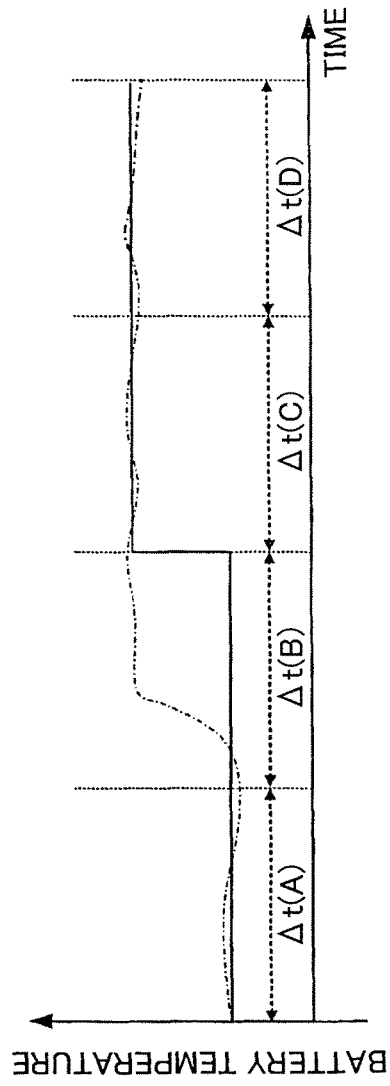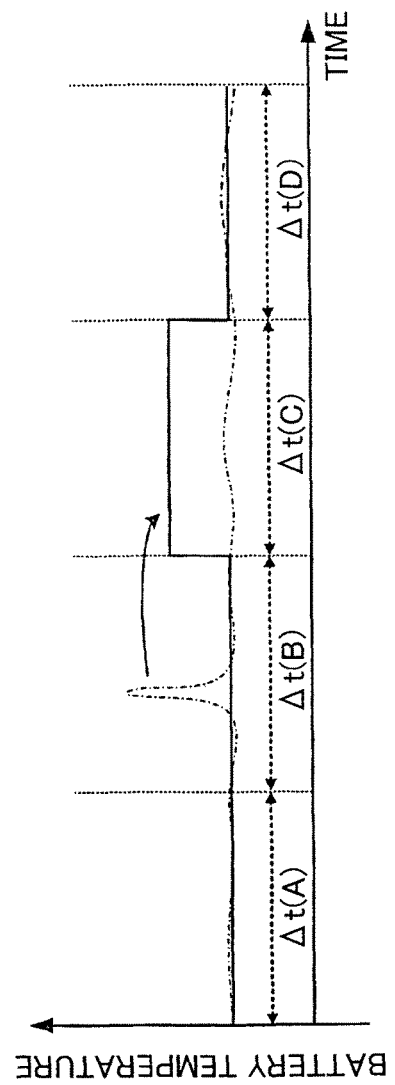

ELECTRIC POWER STORAGE SYSTEM FOR A VEHICLE AND METHOD FOR CONTROLLING ELECTRIC POWER STORAGE SYSTEM FOR A VEHICLE

BACKGROUND OF THE INVENTION

1. Field of the Invention

The invention relates to a technique for estimating a temperature (rest temperature) at a time when an electric power storage device is not charged/discharged.

2. Description of Related Art

Calculation of a degradation rate of an electric power storage unit based on a temporal change in battery temperature is described in Japanese Patent Application Publication No. 2010-035280 (JP 2010-035280 A). In JP 2010-035280 A, the battery temperature for a rest period between external charging completion and ignition switch ON is estimated from a radiation amount of the electric power storage unit.

SUMMARY OF THE INVENTION

JP 2010-035280 A apprehends the change in the battery temperature following a charge/discharge operation using the external charging. However, JP 2010-035280 A does not allow for a rest state where the battery temperature is changed depending on an environmental temperature of a vehicle on which a secondary battery is mounted.

Not only a temperature of the secondary battery at a time when the ignition switch is ON and a temperature after the external charging but also a temperature at a time when the ignition switch is OFF are important in distinguishing a degradation state of the secondary battery. In this case, the secondary battery is at rest, and the temperature of the secondary battery is changed depending on the environmental temperature of the vehicle.

The invention provides an electric power storage system that performs estimation of a rest temperature of an electric power storage device which depends on an environmental temperature of a vehicle on which the electric power storage device is mounted, and a method for controlling the electric power storage system.

An electric power storage system for a vehicle according to an aspect of the invention includes an electric power storage device, a temperature sensor, and a controller. The vehicle includes an ignition switch. The electric power storage device is mounted on the vehicle. The temperature sensor is configured to detect a temperature of the electric power storage device. The controller is configured to estimate a rest temperature of the electric power storage device at a time when the ignition switch is OFF. The controller is configured to acquire the temperature of the electric power storage device at a time when the ignition switch is ON by using the temperature sensor when the ignition switch is turned ON. The controller is configured to estimate the rest temperature by using an average value of at least two of a plurality of the temperatures acquired during a predetermined period. The plurality of temperatures are the temperatures of the electric power storage device which are acquired at a time when the ignition switch is turned ON during the predetermined period. In the above-described aspect, the controller may be configured to acquire the temperature of the electric power storage device at a time when the ignition switch is turned ON by using the temperature sensor every time the ignition switch is turned ON.

The temperature of the electric power storage device during a rest when the ignition switch of the vehicle is OFF is a temperature to which an environmental temperature at which the vehicle is placed is reflected. Accordingly, the temperature of the electric power storage device at a time when the ignition switch of the vehicle is turned ON is a temperature that best reflects the temperature of the electric power storage device which depends on the environmental temperature during the rest.

In this case, a degradation of the electric power storage device corresponding to the rest temperature does not occur over a short period of time. Accordingly, the rest temperature that depends on the changing environmental temperature is unlikely to be apprehended when the rest temperature is estimated from the single temperature. Therefore, the rest temperature is estimated by using the average value of at least two of the plurality of respective temperatures at a time when the ignition switch is turned ON which are detected during the predetermined period. Then, the rest temperature of the electric power storage device that depends on the environmental temperature of the vehicle on which the electric power storage device is mounted can be accurately estimated.

In the above-described aspect, the controller may be configured to estimate the rest temperature by using an average value of a first temperature and a second temperature. The first temperature is a temperature regarded as a maximum value of the plurality of temperatures and the second temperature is a temperature regarded as a minimum value of the plurality of temperatures.

When the rest temperature is estimated based on the temperature of the electric power storage device at a time when the ignition switch is turned ON, a difference may occur in the estimated rest temperature, depending on timing when the ignition switch is turned ON, if the timing when the ignition switch is turned ON is regular.

The rest temperature is estimated by using the two-temperature average value of the first temperature that is regarded as the maximum value of the plurality of temperatures detected during the predetermined period and the second temperature that is regarded as the minimum value of the plurality of temperatures detected during the predetermined period. Then, the estimation of the rest temperature can be performed with the difference attributable to the regularity of the timing when the ignition switch is turned ON suppressed.

For example, the rest temperature is estimated by using the two-temperature average value of the first temperature regarded as the maximum value and the second temperature regarded as the minimum value in all of a plurality of temperature distributions including a temperature other than a temperature of a time slot when the ignition switch is regularly turned ON even in a case where the ignition switch is turned ON early in the morning in most cases. Accordingly, the estimation of the rest temperature can be performed with the difference attributable to the regularity of the time slot when the ignition switch is turned ON suppressed.

In the above-described aspect, the first temperature may be a highest temperature of the plurality of temperatures and the second temperature may be a lowest temperature of the plurality of temperatures. When the rest temperature is estimated by using the two-temperature average value of the highest temperature and the lowest temperature for the predetermined period, the rest temperature to which a use environment of a user for the predetermined period is best reflected can be estimated while suppressing the difference attributable to the regularity of the time slot when the ignition switch is turned ON.

In the above-described aspect, the first temperature may be a second-highest temperature of the plurality of temperatures and the second temperature may be a second-lowest temperature of the plurality of temperatures. A noise may be temporarily included in a detection signal that is detected by the temperature sensor. In this case, the noise is included also in the estimated rest temperature when the temperature including the noise is the highest temperature and the lowest temperature for the predetermined period. Therefore, the rest temperature is estimated by using the two-temperature average value of the second-highest temperature and the second-lowest temperature for the predetermined period. Then, the noise that is included in each of the temperatures which are detected during the predetermined period and are detected when the ignition switch is turned ON can be suppressed.

In the above-described aspect, the controller may be configured to determine whether or not an elapsed time continuing until the ignition switch is turned ON from a moment at which the ignition switch is turned OFF is longer than a predetermined time. And the controller may be configured to acquire the temperature of the electric power storage device at a time when the ignition switch is turned ON during the predetermined period when the elapsed time is longer than the predetermined time. With this configuration, the rest temperature can be estimated based on the temperature at a time when the ignition switch is turned ON in which an effect of a charge/discharge operation continuing until the ignition switch is turned OFF is suppressed, and the rest temperature to which the change depending on the environmental temperature during the rest of the vehicle on which the electric power storage device is mounted is best reflected can be estimated.

In the above-described aspect, the controller may be configured to estimate the rest temperature for each of the predetermined period by initializing the plurality of temperatures when the predetermined period elapses. In the above-described aspect, the electric power storage system, the controller may be configured to estimate the rest temperature for each of the predetermined period by initializing the plurality of temperatures every time the predetermined period elapses. For example, the temperature that is detected for the previous predetermined period is initialized even when the use environment of the vehicle is changed from the middle of the predetermined period which is a determination period for the rest temperature. Accordingly, dependence on the use environment for the previous predetermined period can be suppressed, and the rest temperature corresponding to the change in the use environment during the present predetermined period can be estimated. When the use environment of the vehicle is temporarily changed, the rest temperature is changed by reflecting the temporarily changed use environment in the subsequent predetermined period. However, the change in the use environment for the previous predetermined period that is temporarily changed is not reflected in the later subsequent predetermined period.

Accordingly, the rest temperature for each of the later predetermined period can be estimated with dependence on the temporary change in the use environment suppressed.

In the above-described aspect, the controller may be configured to calculate a degradation state corresponding to the estimated rest temperature using a correspondence relation between the degradation state of the electric power storage device and the rest temperature. In general vehicles, a time when the ignition switch is OFF is longer than a time when the ignition switch is ON. Therefore, it is preferable that the rest temperature be allowed for after estimating the degradation state of the electric power storage device. When not only the degradation state at a time when the ignition switch is ON but also the degradation state at a time when the ignition switch is OFF are allowed for, the degradation state of the electric power storage device can be accurately estimated.

According to another aspect of the invention, an electric power storage system for vehicle includes an electric power storage device, a temperature sensor, and a controller. The vehicle includes an ignition switch. The electric power storage device is mounted on the vehicle. The temperature sensor is configured to detect and output a temperature of the electric power storage device. The controller is configured to acquire and accumulate the temperature of the electric power storage device with the temperature sensor when the ignition switch is turned ON during predetermined period. The controller is configured to calculate an average value of the temperatures of the electric power storage device accumulated during the predetermined period. The controller is configured to set the average value as a rest temperature. The rest temperature is the temperature of the electric power storage device available when the ignition switch is OFF. In the above-described aspect, the controller may be configured to acquire and accumulate the temperature of the electric power storage device at a time when the ignition switch is turned ON by using the temperature sensor every time the ignition switch is turned ON.

In another aspect of the invention, a method for controlling an electric power storage system for a vehicle includes an electric power storage device, a temperature sensor, and a controller. The vehicle includes an ignition switch. The electric power storage device is mounted on the vehicle. The temperature sensor is configured to detect and output a temperature of the electric power storage device. The control method includes acquiring, using the temperature sensor, the temperature of the electric power storage device when the ignition switch is turned ON during predetermined period; accumulating, by the controller, the temperature of the electric power storage device when the ignition switch is turned ON; calculating, by the controller, an average value of the temperature of the electric power storage device accumulated during the predetermined period; and setting, by the controller, the average value as a rest temperature. The rest temperature is the temperature of the electric power storage device available when the ignition switch is OFF. In the above-described aspect, the temperature of the electric power storage device may be acquired, using the temperature sensor, every time the ignition switch is turned ON during a predetermined period. The temperature of the electric power storage device may be accumulated, by the controller, every time the ignition switch is turned ON.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 8 is a flowchart illustrating a processing for estimating a rest temperature of a battery pack according to the second embodiment;

FIG. 9 is a diagram illustrating a rest temperature change in a case where a vehicle environment is changed according to the second embodiment; and FIG. 10 is a diagram illustrating a rest temperature change in a case where the vehicle environment is temporarily changed according to the second embodiment.

DETAILED DESCRIPTION OF EMBODIMENTS

Hereinafter, embodiments of the invention will be described.

Figure 1:
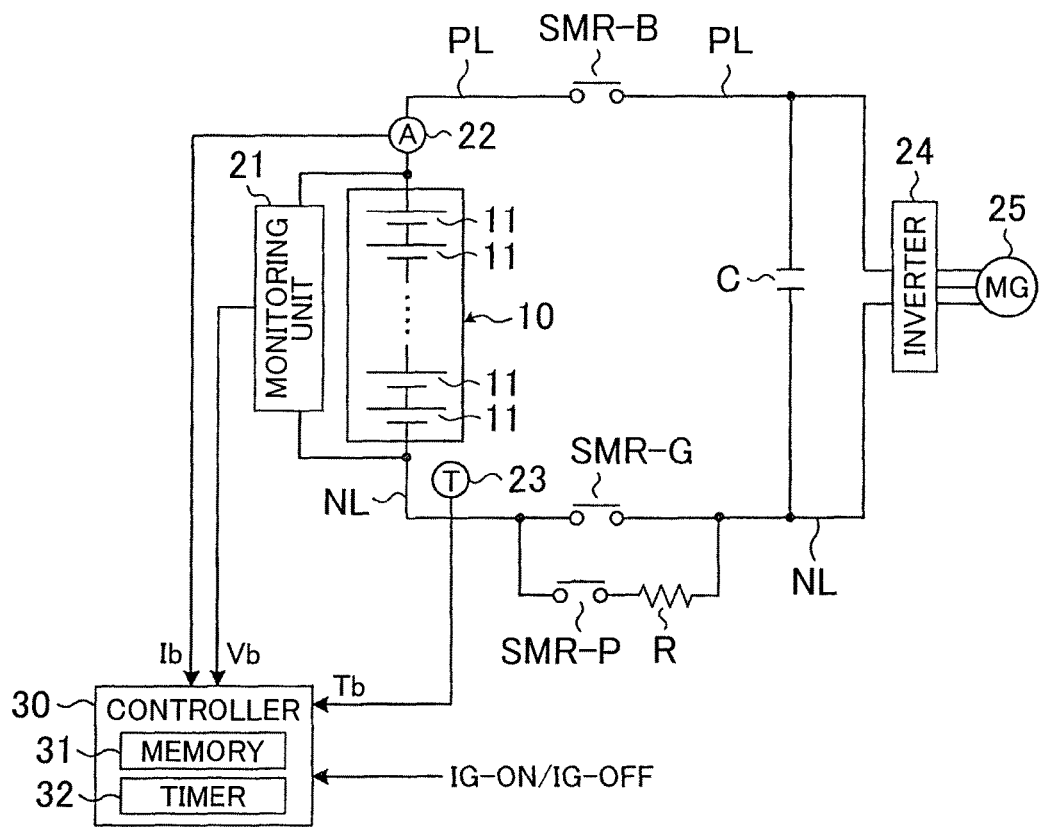
FIG. 1 is a diagram illustrating a configuration of a battery system according to a first embodiment.

A first embodiment will be described. FIG. 1 is a diagram illustrating a configuration of a battery system (corresponding to an electric power storage system according to the invention) according to this embodiment. The battery system that is illustrated in FIG. 1 is mounted on a vehicle. Examples of this vehicle include a hybrid car and an electric car. The hybrid car is provided with another power source such as an internal combustion engine and a fuel cell, in addition to a battery pack (described later), as a power source for traveling of the vehicle. The electric car is provided only with the battery pack (described later) as the power source for traveling of the vehicle.

The battery pack (corresponding to an electric power storage device of the invention) 10 has a plurality of single batteries 11 that are connected in series. A secondary battery such as a nickel-hydrogen battery and a lithium ion battery can be used as the single battery 11. An electric double layer capacitor can be used instead of the secondary battery.

The number of the single batteries 11 can be appropriately set based on an output demand of the battery pack 10 and the like. In this embodiment, the single batteries 11 are connected in series without exception to constitute the battery pack 10. However, the invention is not limited thereto. The battery pack 10 can include a plurality of single batteries 11 that are connected in parallel.

A monitoring unit 21 detects a voltage value Vb of the battery pack 10 or detects the voltage value Vb of each of the single batteries 11, and outputs a detection result to a controller 30. A current sensor 22 detects a current Ib that flows in the battery pack 10 and outputs a detection result to the controller 30. In this embodiment, a positive value is used as the current value (discharging current) Ib when the battery pack 10 is discharged. A negative value is used as the current value (charging current) Ib when the battery pack 10 is charged.

In this embodiment, the current sensor 22 is disposed on a positive line PL that is connected to a positive terminal of the battery pack 10. The current sensor 22 may be capable of detecting the current Ib that flows in the battery pack 10, and a position where the current sensor 22 is disposed can be appropriately set. For example, the current sensor 22 can be disposed on a negative line NL that is connected to a negative terminal of the battery pack 10. A plurality of the current sensors 22 can be disposed.

A temperature sensor 23 detects a temperature Tb of the battery pack 10 (single battery 11) and outputs a detection result to the controller 30. The temperature sensor 23 can be arranged at a plurality of places in the battery pack 10 when the temperatures Tb are different between positions of the single batteries 11 that are included in the battery pack 10. In this manner, the temperature Tb of each of the single batteries 11 can be accurately detected.

The controller 30 has a memory 31 and a timer 32. The memory 31 stores various types of information for the controller 30 to perform a predetermined processing (for example, a processing that is described in this embodiment). The timer 32 is used in time measurement. In this embodiment, the memory 31 and the timer 32 are built into the controller 30. However, at least one of the memory 31 and the timer 32 can be disposed out of the controller 30.

A system main relay SMR-B is disposed on the positive line PL. The system main relay SMR-B is switched between ON and OFF by receiving a control signal from the controller 30. A system main relay SMR-G is disposed on the negative line NL. The system main relay SMR-G is switched between ON and OFF by receiving the control signal from the controller 30.

A system main relay SMR-P and a current limiting resistance R are connected in parallel to the system main relay SMR-G. The system main relay SMR-P and the current limiting resistance R are connected in series. The system main relay SMR-P is switched between ON and OFF by receiving the control signal from the controller 30.

The current limiting resistance R is used to suppress inrush current flow in a capacitor C when the battery pack 10 is connected to a load (specifically, an inverter 24 (described later)). The capacitor C is connected to the positive line PL and the negative line NL and is used to smooth a voltage fluctuation between the positive line PL and the negative line NL.

Information relating to vehicle ignition switch ON/OFF (IG-ON/IG-OFF) is input to the controller 30. The controller 30 performs ON/OFF control on the system main relays SMR-B, SMR-G, SMR-P in response to OFF-to-ON switching of an ignition switch, connects the battery pack 10 to the inverter 24, and starts the battery system that is illustrated in FIG. 1.

When the ignition switch is switched from OFF to ON, the controller 30 first switches the system main relay SMR-B from OFF to ON and switches the system main relay SMR-P from OFF to ON. Then, the discharging current of the battery pack 10 flows to the current limiting resistance R and the inrush current flow in the capacitor C is suppressed.

Next, the controller 30 switches the system main relay SMR-G from OFF to ON and switches the system main relay SMR-P from ON to OFF. Then, connection between the battery pack 10 and the inverter 24 is completed, and the battery system that is illustrated in FIG. 1 is in a start state (ready-on).

When the ignition switch is switched from ON to OFF, the controller 30 switches the system main relays SMR-B, SMR-G from ON to OFF. Then, the connection between the battery pack 10 and the inverter 24 is cut off, and the battery system that is illustrated in FIG. 1 is in a stop state (ready-off).

The inverter 24 converts DC power that is output from the battery pack 10 to AC power and outputs the AC power to a motor generator (MG) 25. A three-phase AC motor or the like can be used as the motor generator 25. The motor generator 25 generates kinetic energy for traveling of the vehicle by receiving the AC power that is output from the inverter 24. The kinetic energy that is generated by the motor generator 25 is transmitted to vehicle wheels to allow the vehicle to travel.

When the vehicle is decelerated or stopped, the motor generator 25 converts kinetic energy that is generated during vehicle braking to electric energy (AC power). The inverter 24 converts the AC power that is generated by the motor generator 25 to DC power and outputs the DC power to the battery pack 10. In this manner, the battery pack 10 can store regenerative electric power.

In this embodiment, the battery pack 10 is connected to the inverter 24. However, the invention is not limited thereto. Specifically, a booster circuit can be disposed on a current path between the battery pack 10 and the inverter 24. The booster circuit can boost an output voltage of the battery pack 10 and output electric power after the boost to the inverter 24. Also, the booster circuit can step down an output voltage of the inverter 24 and output electric power after the step-down to the battery pack 10.

When the ignition switch is ON in the battery system according to this embodiment, the temperature of the battery pack 10 (single battery 11) can be detected by the temperature sensor 23. When the ignition switch is OFF, the temperature of the battery pack 10 (single battery 11) cannot be detected by the temperature sensor 23.

In this embodiment, the temperature of the battery pack 10 (single battery 11) is estimated as described below while the ignition switch is OFF. The temperature of the battery pack 10 (single battery 11) at a time when the ignition switch is OFF is referred to as a rest temperature.

In this embodiment, the rest temperature $Tb\_rest$ of the battery pack 10 is estimated based on a battery temperature $Tb\_igon$ of the battery pack 10 that is available immediately after the ignition switch is turned ON. Specifically, the battery temperature at a time when the ignition switch is turned ON, that is, the latest battery temperature $Tb\_igon$ during a rest when the ignition switch is switched from OFF to ON (during a non-start of the battery system) is acquired from the temperature sensor 23 every time the ignition switch is turned ON. A plurality of battery temperatures $Tb\_igon$ of the battery pack 10 available immediately after the ignition switch is turned ON are sampled, and each of the sampled battery temperatures $Tb\_igon$ is used to estimate the rest temperature $Tb\_rest$ of the battery pack 10.

Figure 2:
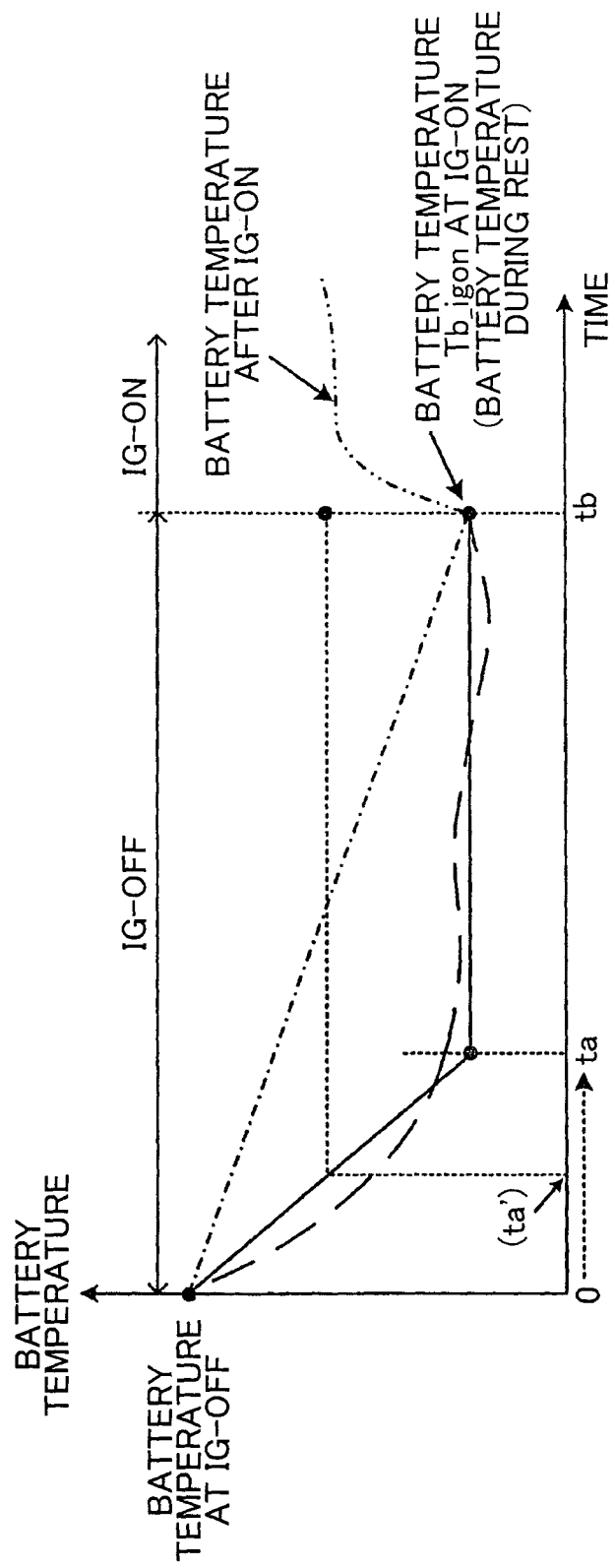
FIG. 2 is a diagram illustrating a battery temperature transition from previous IG-OFF to IG-ON according to the first embodiment.

FIG. 2 is a diagram illustrating a battery temperature transition in the battery pack 10 from previous ignition switch OFF to ignition switch ON. The dotted line in FIG. 2 illustrates an actual battery temperature transition that is obtained in an experiment or the like. The solid line in FIG. 2 illustrates an estimated battery temperature transition that is obtained by linear interpolation of the actual battery temperature transition.

As illustrated in FIG. 2, the battery pack 10 generates heat through a charge/discharge operation and the battery temperature Tb is in a high state until the ignition switch is turned OFF. After the ignition switch is turned OFF, the charge/discharge operation of the battery pack 10 is stopped and the battery temperature Tb of the battery pack 10 is declined depending on heat dissipation characteristics of the battery pack 10, an environmental temperature (outside air temperature), and the like.

In the example of FIG. 2, the battery temperature Tb becomes a temperature depending on the environmental temperature when, for example, a time ta elapses after the ignition switch is turned OFF, and is subjected to a transition into a substantially constant temperature between the time ta and a time tb when the ignition switch is turned ON.

As described above, the battery temperature is affected by the charge/discharge operation that continues until the ignition switch is turned OFF and is declined from a high-temperature state to a temperature in a state corresponding to the environmental temperature until the time ta elapses after the ignition switch is turned OFF. However, the battery temperature is subjected to a transition corresponding to the environmental temperature after the time ta elapses.

In this case, regarding the battery temperature during a period (short rest period) that continues for the time ta after the ignition switch is turned OFF, the rest temperature during the short rest period can be estimated by linear interpolation processing, in which the battery temperature at a time when the ignition switch is turned OFF and the battery temperature at the time ta are used, in view of the temperature transition affected by the charge/discharge operation continuing until the ignition switch is turned OFF as illustrated by, for example, the solid line.

However, the linear interpolation processing-based estimation of the rest temperature between ignition switch OFF and the time tb when the ignition switch is turned ON results in a divergence from the battery temperature of the battery pack 10 that is changed depending on the environmental temperature of the vehicle as illustrated by the one-dot chain line in FIG. 2, and thus the rest temperature of the battery pack 10 depending on the environmental temperature of the vehicle cannot be apprehended with accuracy.

Accordingly, the battery temperature $Tb\_igon$ that is available immediately after the ignition switch is turned ON is the battery temperature (rest temperature $Tb\_rest$) of the battery pack 10 to which an environment during the rest of the vehicle on which the battery pack 10 is mounted is best reflected. In this embodiment, the rest temperature $Tb\_rest$ of the battery pack 10 that continues while the ignition switch is OFF is estimated based on the battery temperature $Tb\_igon$ that is available immediately after the ignition switch is turned ON.

In the example of FIG. 2, the period between the time ta and the time tb when the ignition switch is turned ON is a period that is sufficiently longer than the period which continues for the time ta after the ignition switch is turned OFF. Accordingly, the battery temperature during the short rest period that is changed by being affected by the charge/discharge operation can be substantially ignored even when the rest temperature during a long rest period that continues until the ignition switch is turned ON after the ignition switch is turned OFF is estimated by using the battery temperature $Tb\_igon$ which is available immediately after the ignition switch is turned ON.

Figure 3:
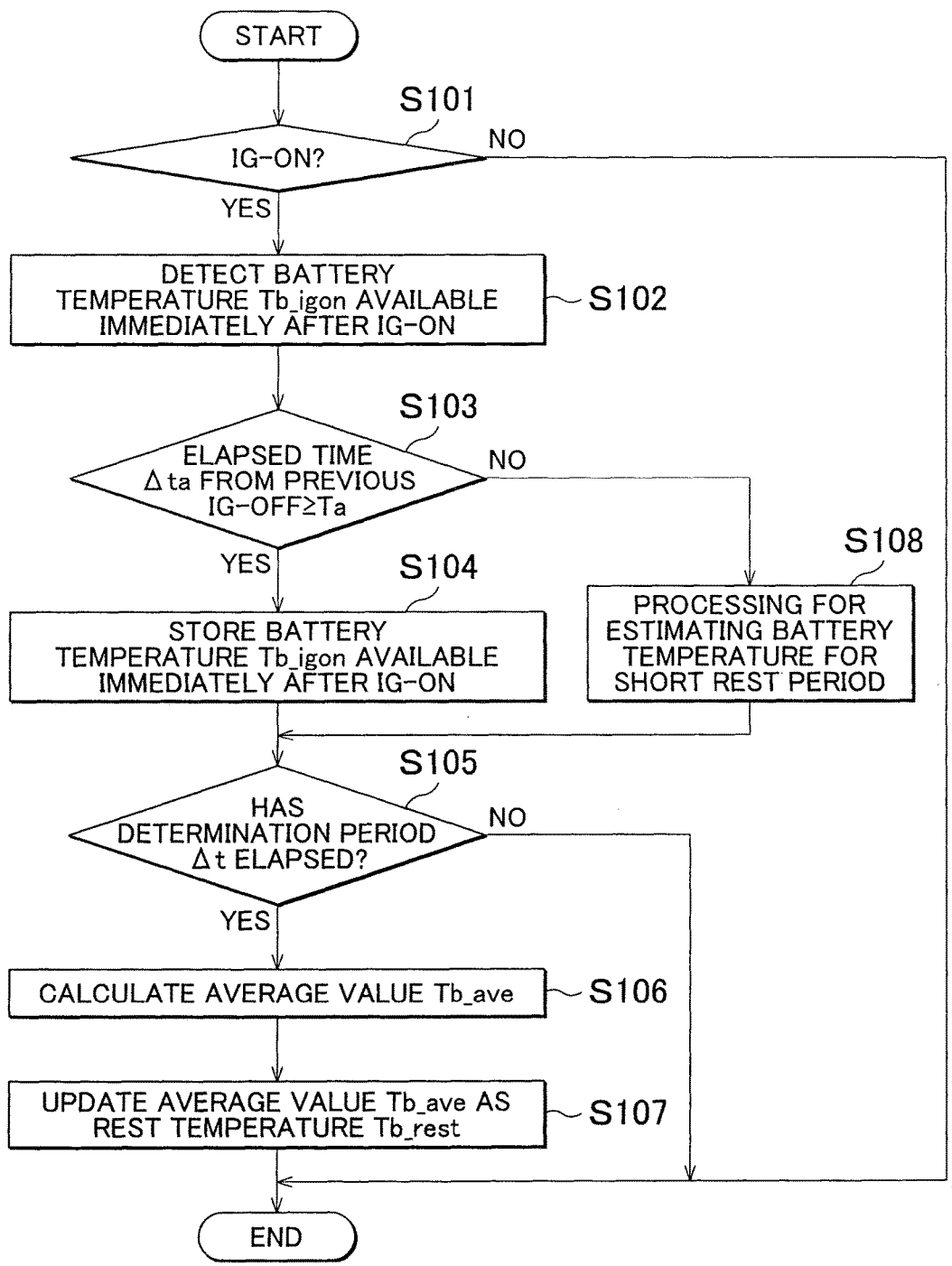
FIG. 3 is a flowchart illustrating a processing for estimating a rest temperature of a battery pack according to the first embodiment.

Next, a processing for estimating the rest temperature of the battery pack 10 will be described with reference to the flowchart that is illustrated in FIG. 3. The processing that is illustrated in FIG. 3 is executed by the controller 30.

In Step S101, the controller 30 determines whether or not the ignition switch is ON. When the ignition switch is ON, the controller 30 allows the processing to proceed to Step S102 and detects the battery temperature $Tb\_igon$ that is available immediately after the ignition switch is turned ON. Examples of the moment immediately after the ignition switch is turned ON include a period prior to the connection between the battery pack 10 and the inverter 24 through ON control performed on the system main relay SMR-B or the like and a period prior to initiation of charge/discharge by the battery pack 10 which is connected to the inverter 24. In other words, the battery temperature during a period when a rise in the battery temperature Tb resulting from the charge/discharge operation by the battery pack 10 after ignition switch ON does not occur (heat generation attributable to the charge/discharge operation does not occur) is detected as the battery temperature Tb_igon.

Regarding the battery temperature Tb_igon that is available immediately after the ignition switch is turned ON, the single battery temperature Tb that is detected by the temperature sensor 23 may be acquired as the battery temperature Tb_igon. However, the invention is not limited thereto. For example, a plurality of the battery temperatures Tb may be acquired by the temperature sensor 23, over a plurality of times and at predetermined intervals, immediately after the ignition switch is turned ON and an average value of the battery temperatures Tb may be calculated as the battery temperature Tb_igon.

In Step S103, the controller 30 detects the battery temperature Tb_igon that is available immediately after the ignition switch is turned ON, and determines whether or not the elapsed time ta between previous ignition switch OFF and ignition switch ON is longer than a predetermined time Ta.

The controller 30 can measure the elapsed time after ignition switch OFF by using the timer 32. Accordingly, the controller 30 can, for example, measure the elapsed time ta between ignition switch OFF and ON and can calculate the elapsed time ta by calculating a difference between a moment at which the ignition switch is turned OFF and a moment at which the ignition switch is turned ON.

In the processing of Step S103, the battery temperature Tb that is available after the ignition switch is turned OFF is affected by the charge/discharge operation that continues until the ignition switch is turned OFF as described above. Accordingly, the rest temperature during ignition switch OFF depending on the environmental temperature of the vehicle cannot be estimated.

The predetermined time (Ta) that is taken for the battery temperature Tb available after the ignition switch is turned OFF to become a temperature which is not affected by the charge/discharge operation continuing until the ignition switch is turned OFF, that is, to become the battery temperature Tb depending on the environmental temperature during the rest is obtained in advance in an experiment. Then, the battery temperature Tb_igon in a case where the elapsed time to is shorter than the predetermined time Ta is controlled not to be reflected to the estimation of the rest temperature depending on the environmental temperature of the vehicle.

The predetermined time (Ta) that is taken until becoming the battery temperature Tb depending on the environmental temperature during the rest may be a fixed value or may be a variable value. For example, a maximum time between ignition switch OFF and decline to the battery temperature corresponding to the environmental temperature can be obtained in advance in an experiment or the like and the value can be the fixed value of the predetermined time (Ta) that is taken until becoming the battery temperature Tb depending on the environmental temperature during the rest.

A decrement of the battery temperature Tb after ignition switch OFF per unit time is obtained in advance from a radiation amount of the battery pack 10 (single battery 11). In the example of FIG. 2, a battery temperature Tb_igoff that is available after the ignition switch is turned OFF is declined at a constant gradient corresponding to the decrement per unit time. Accordingly, a time corresponding to an intersection between the battery temperature Tb_igon that is available immediately after the ignition switch is turned ON and the battery temperature that is available after the ignition switch is turned OFF, which is declined at the constant gradient, can be obtained as the predetermined time (Ta) which is taken until becoming the battery temperature Tb_igon depending on the environmental temperature during the rest.

The controller 30 may acquire the battery temperature Tb_igoff at a time when the ignition switch is turned OFF in advance from the temperature sensor 23 and calculate the predetermined time (Ta) that is taken until becoming the battery temperature Tb depending on the environmental temperature during the rest from the battery temperature transition after ignition switch OFF based on the temperature decrement per unit time when the battery temperature Tb_igon which is available immediately after the ignition switch is turned ON is detected. In this case, the elapsed time ta that is taken until becoming the battery temperature Tb corresponding to the environmental temperature during the rest, which is illustrated in FIG. 2, is short (for example, time ta' in the example of FIG. 2) in a case where the battery temperature Tb_igon that is available immediately after the ignition switch is turned ON is high as in, for example, summer. The predetermined time (Ta) that is taken until becoming the battery temperature Tb depending on the environmental temperature during the rest may vary depending on use environments of summer and winter.

In a case where the elapsed time ta between previous ignition switch OFF and ignition switch ON is determined to be longer than the predetermined time Ta in Step S103, the controller 30 stores the battery temperature Tb_igon that is detected in Step S102 in the memory 31 as the battery temperature which is detected during a predetermined period Δt so as to estimate the rest temperature Tb_rest in Step S104.

In other words, the controller 30 can use the battery temperature Tb_igon that is detected when the ignition switch is ON as the battery temperature that is detected during the predetermined period Δt so as to estimate the rest temperature Tb_rest when the elapsed time ta is longer than the predetermined time Ta. With this configuration, the rest temperature Tb_rest can be estimated based on the battery temperature Tb_igon at a time when the ignition switch is ON in which the effect of the charge/discharge operation continuing until the ignition switch is turned OFF is suppressed, and the rest temperature to which the change depending on the environmental temperature during the rest of the vehicle on which the electric power storage device is mounted is best reflected can be estimated.

The processing for detecting the battery temperature Tb_igon in Step S102 can also be configured to be executed after the processing for determining the elapsed time ta between previous ignition switch OFF and ignition switch ON in Step S103.

In Step S105, the controller 30 determines whether or not the elapsed time to the present moment exceeds the previously-set predetermined period Δt for sampling of the battery temperature Tb_igon that is available immediately after the ignition switch is turned ON based on the time measurement by the timer 32. For example, the controller 30 can determine whether or not the elapsed time between the point of time when the sampling of the battery temperature Tb_igon is initiated and the present point of time exceeds the predetermined period Δt based on the time measurement by the timer 32. The predetermined period Δt can be any period such as one month, three months, six months, and one year.

In this embodiment, a degradation amount of the battery pack 10 is estimated based on the rest temperature Tb_rest of the battery pack 10 as described later. In most cases, the battery pack 10 is degraded not over a short period of time but over a long period of time. Accordingly, the predetermined period Δt for specifying the rest temperature Tb_rest so as to estimate the degradation amount of the battery pack 10 can be set as a long period of time of at least several months.

As described above, the plurality of battery temperatures Tb_igon are sampled for a certain period of time in this embodiment. The rest temperature of the battery pack 10 is updated (estimated) at a point of time when a certain amount and number of samples are accumulated.

In Step S106, the controller 30 calculates the average value of the battery temperatures Tb_igon detected during the predetermined period Δt as a representative battery temperature Tb_ave for the predetermined period Δt in a case where it is determined that the predetermined period Δt has elapsed. In this case, the controller 30 can calculate the representative battery temperature Tb_ave by using at least two of the plurality of respective battery temperatures Tb_igon which are detected during the predetermined period Δt.

In Step S107, the controller 30 updates the rest temperature Tb_rest of the battery pack 10 by using the representative battery temperature Tb_ave for the predetermined period Δt calculated in Step S106. The updated rest temperature Tb_rest is stored on the memory 31. In this case, the controller 30 can store a temperature frequency distribution for each updated rest temperature Tb_rest on the memory 31 so as to use the rest temperature Tb_rest in estimating the degradation amount of the battery pack 10 at a time when the ignition switch is OFF (described later). Temperature frequency refers to a ratio of time at which the battery pack 10 is present in each battery temperature (rest temperature Tb_rest) during a period of use of the battery pack 10 (for example, a period between an initial manufacturing period and the present).

In a case where it is determined that the elapsed time ta between previous ignition switch OFF and ignition switch ON is shorter than the predetermined time Ta in Step S103 in the example of FIG. 3, the processing proceeds to Step S108 and a processing for estimating the battery temperature (rest temperature) during the short rest period is performed.

As described in the example of FIG. 2, the battery temperature during the period (short rest period) that continues for the time ta after the ignition switch is turned OFF can be estimated by the linear interpolation processing in which the battery temperature at a time when the ignition switch is turned OFF and the battery temperature at a time when the ignition switch is turned ON are used.

The controller 30 stores the battery temperature that is detected from the temperature sensor 23 when the ignition switch is turned OFF in advance on the memory 31. In a case where the elapsed time ta is determined to be shorter than the predetermined time Ta in Step S103, the controller 30 calculates the temperature transition for the short rest period by the linear interpolation by using the battery temperature at a time when the ignition switch is OFF and the battery temperature Tb_igon at a time when the ignition switch is turned ON which are stored on the memory 31. Then, the controller 30 can, for example, calculate the battery temperature for the short rest period for each predetermined time based on the calculated temperature transition and store the temperature frequency distribution for the short rest period on the memory 31 based on the calculated battery temperature.

As described above, the battery temperature during the rest when the ignition switch is OFF is divided into the short rest period and the long rest period and the rest temperature in a long-term rest state that is not affected by the temperature change which results from the charge/discharge operation can be estimated, even when the ignition switch is OFF, from the battery temperature that is available immediately after the ignition switch is turned ON according to the method for estimating the rest temperature of this embodiment.

Figure 4:
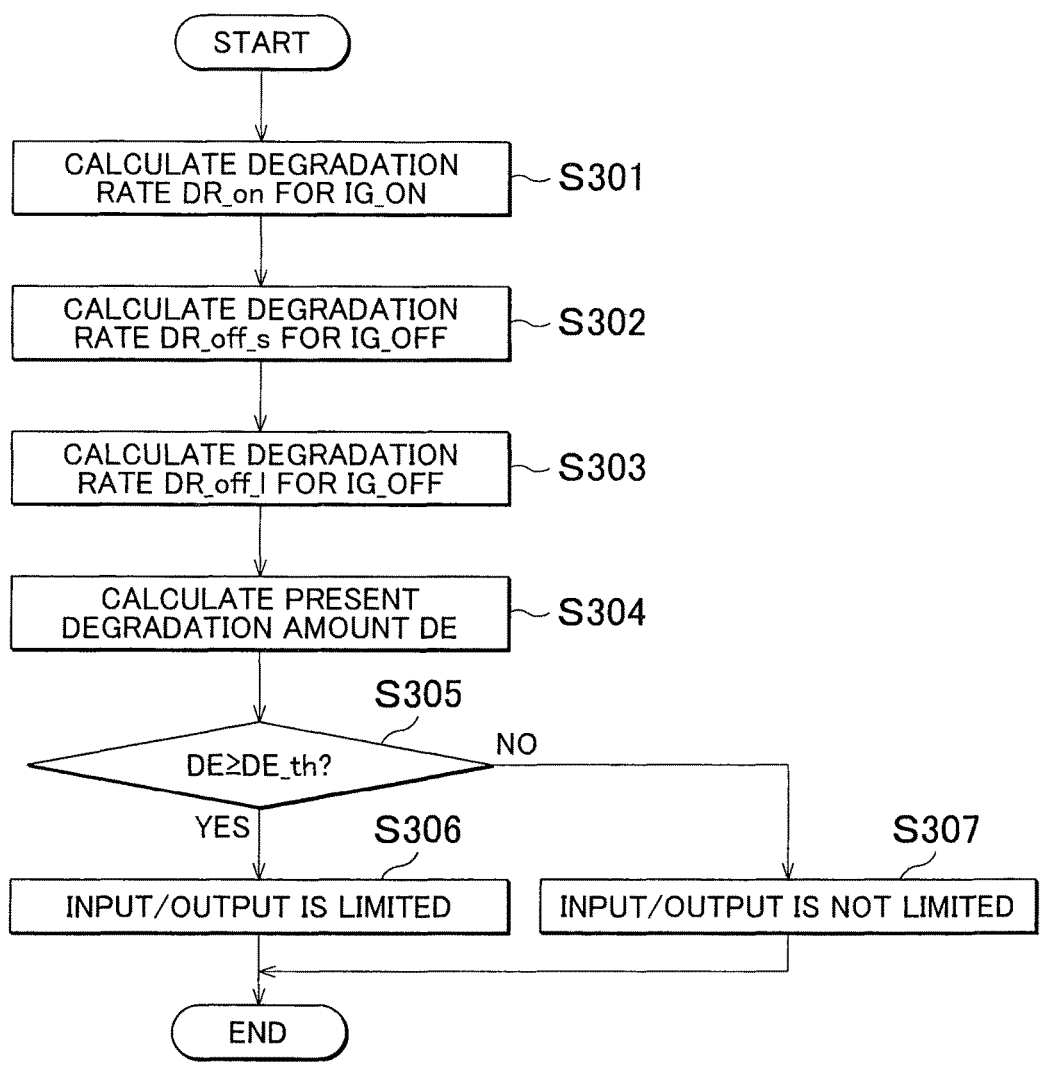
FIG. 4 is a flowchart illustrating a processing for controlling input/output of the battery pack according to the first embodiment.

As described above, the degradation amount of the battery pack 10 can be estimated based on the rest temperature Tb_rest when the rest temperature Tb_rest of the battery pack 10 is estimated. Also, input/output (charge/discharge) of the battery pack 10 can be controlled based on the estimated degradation amount. A processing for controlling the input/output of the battery pack 10 based on the degradation amount will be described with reference to the flowchart that is illustrated in FIG. 4. The processing that is illustrated in FIG. 4 is executed by the controller 30.

In Step S301, the controller 30 calculates a degradation rate DR_on of the battery pack 10 at a time when the ignition switch is ON. The degradation rate DR_on is an increment of the degradation amount per unit time. The degradation of the battery pack 10 depends on the battery temperature Tb of the battery pack 10, and thus the degradation rate DR_on can be calculated based on the battery temperature Tb.

Specifically, the degradation rate DR_on that corresponds to the battery temperature Tb can be specified by detecting the battery temperature Tb if a correspondence relation between the battery temperature Tb and the degradation rate DR_on is obtained in advance. Herein, regarding the correspondence relation between the battery temperature Tb and the degradation rate DR_on, the degradation rate DR_on can be increased when the battery temperature Tb increases.

The degradation of the battery pack 10 also depends on a state of charge (SOC) of the battery pack 10. The SOC is a ratio of a present charge capacity to a full charge capacity. Accordingly, the degradation rate DR_on that corresponds to the SOC can be specified by estimating the SOC of the battery pack 10 if a correspondence relation between the degradation rate DR_on and the SOC is obtained in advance. A known method can be appropriately used as a method for estimating the SOC. For example, the SOC of the battery pack 10 can be estimated by continuing to integrate a current value that is available when the battery pack 10 is charged/discharged.

Figure 5:
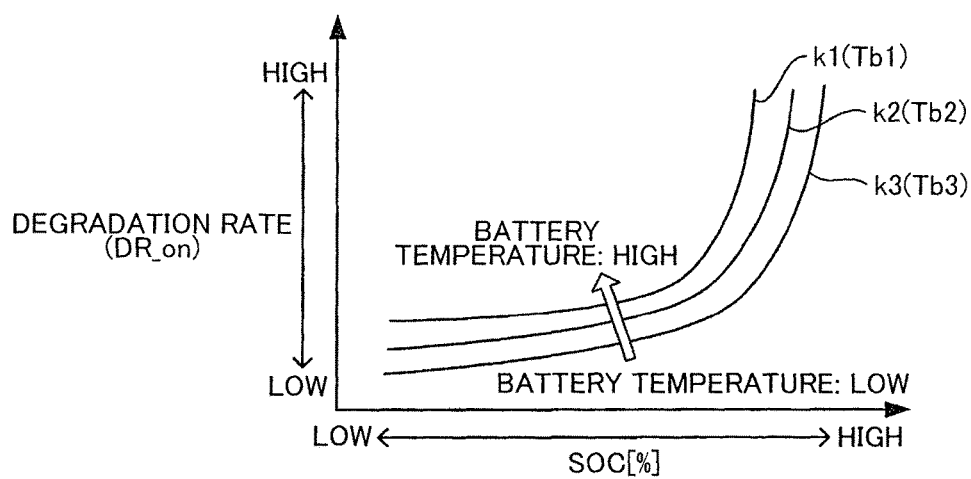
FIG. 5 is a diagram illustrating a correspondence relation between a degradation rate, a battery temperature, and an SOC according to the first embodiment.

The degradation rate DR_on can also be calculated based on the battery temperature Tb and the SOC of the battery pack 10. Specifically, if a correspondence relation between the degradation rate DR_on, the battery temperature Tb, and the SOC is obtained in advance, the degradation rate DR_on can be calculated by using the correspondence relation as illustrated in FIG. 5. The vertical axis in FIG. 5 represents the degradation rate DR_on and the horizontal axis in FIG. 5 represents the SOC.

The curves k1, k2, k3 that are illustrated in FIG. 5 represent the correspondence relation between the degradation rate DR_on and the SOC. As illustrated by the curves k1, k2, k3, the degradation rate DR_on increases as the SOC of the battery pack 10 increases. In other words, the degradation rate DR_on decreases as the SOC of the battery pack 10 decreases.

The battery temperatures Tb differ from each other in the curves k1, k2, k3. The battery temperature Tb1 that defines the curve k1 is higher than the battery temperature Tb2 that defines the curve k2. The battery temperature Tb2 is higher than the battery temperature Tb3 that defines the curve k3. As described above, the degradation rate DR_on increases as the battery temperature Tb increases. In other words, the degradation rate DR_on decreases as the battery temperature Tb decreases.

Examples of the degradation include an increase in internal resistance of the battery pack 10 (single battery 11) in the case of the lithium ion battery and a decline in negative hydrogen amount in the case of the nickel-hydrogen battery. The increase in internal resistance and the decline in negative hydrogen amount are changed according to the battery temperature Tb and the SOC as illustrated in the example of FIG. 5.

In Steps S302, S303, the controller 30 obtains a degradation rate DR_off_s and a degradation rate DR_off_1 of the battery pack 10 at a time when the ignition switch is OFF. As is the case with the degradation rate DR_on, the degradation rates DR_off_s, DR_off_1 can be calculated based on at least one of the battery temperature Tb and the SOC of the battery pack 10. When the degradation rate DR_off_s is calculated in view of the battery temperature Tb, the battery temperature for the short rest period that is estimated in Step S108 in FIG. 3 is used as the battery temperature Tb. The rest temperature Tb_rest that is estimated in the processing which is illustrated in FIG. 3 is used as the battery temperature Tb when the degradation rate DR_off_s is calculated.

In this case, the controller 30 can calculate the degradation rate DR_on for each battery temperature based on the temperature frequency in Step S301. For example, the increment of the degradation rate differs from battery temperature to battery temperature as illustrated in FIG. 5, and thus the respective degradation rates DR_on can be calculated for the respective battery temperatures at which the battery pack 10 is present based on the temperature frequency distribution. This is the same for the degradation rates DR_off_s, DR_off_1.

In Step S304, the controller 30 calculates a present degradation amount DE of the battery pack 10. Specifically, the degradation amount DE_on can be calculated by integrating the degradation rate DR_on that is calculated in the processing in Step S301 by a period when the ignition switch is ON. For example, the degradation rate DR_on of the battery temperature that is calculated in Step S301 is integrated by the time of the presence of the battery temperature. This is calculated for each battery temperature in the temperature frequency. Then, each degradation amount of each battery temperature can be added so as to calculate the degradation amount DE_on for the period when the ignition switch is ON.

Then, a degradation amount DE_off_s can be calculated by integrating the degradation rate DR_off_s that is calculated in the processing in Step S302 by the period when the ignition switch is OFF during the short rest period which corresponds to the battery temperature estimated in Step S108 in FIG. 3. Likewise, a degradation amount DE_off_1 can be calculated by integrating the degradation rate DR_off_1 that is calculated in the processing in Step S303 by the period when the ignition switch is OFF during the long rest period which corresponds to the rest temperature Tb_rest estimated in the processing illustrated in FIG. 3. Even in this case, the controller 30 integrates, for example, the degradation rate DR_off_1 of the rest temperature Tb_rest that is calculated in Step S303 by the time of the presence of the temperature. This is calculated for each rest temperature Tb_rest in the temperature frequency for the long rest period. Then, each degradation amount for each rest temperature Tb_rest can be added so as to calculate the degradation amount DE_off_1 for the period when the ignition switch is OFF. This is the same for the degradation rate DR_off_s.

Then, the present degradation amount DE can be calculated by adding the degradation amounts DE_on, DE_off_s, DE_off_1.

In this embodiment, not only the degradation amount DE_on but also the degradation amount DE_off (DE_off_1) are calculated, and thus the present degradation amount DE can be estimated with improved accuracy. In general, the time when the ignition switch is OFF is longer than the time when the ignition switch is ON. Accordingly, the battery temperature Tb (rest temperature Tb_rest) at a time when the ignition switch is OFF largely affects the degradation of the battery pack 10. When not only the degradation amount DE_on but also the degradation amount DE_off (DE_off_1) are calculated as in this embodiment, the present degradation amount DE can be estimated with improved accuracy.

In Step S305, the controller 30 determines whether or not the degradation amount DE that is calculated in the processing in Step S303 is equal to or above a threshold DE_th. The threshold DE_th is a value that is used to determine whether or not to limit the input/output of the battery pack 10. The threshold DE_th can be appropriately set.

The input/output of the battery pack 10 is more likely to be limited as the threshold DE_th decreases (described later). When the input/output is more likely to be limited, vehicle drivability may be adversely affected. The input/output of the battery pack 10 is less likely to be limited as the threshold DE_th increases. When the input/output is less likely to be limited, the degradation of the battery pack 10 may be accelerated.

The threshold DE_th can be set in view of the above, and information relating to the threshold DE_th can be stored on the memory 31. The controller 30 limits the input/output of the battery pack 10 when the degradation amount DE is equal to or above the threshold DE_th in Step S306. The controller 30 does not limit the input/output of the battery pack 10 in Step S307 even when the degradation amount DE is below the threshold DE_th.

An upper limit electric power that allows input (charge) and an upper limit electric power that allows output (discharge) are set when the input/output of the battery pack 10 is controlled. Each of the upper limit electric powers relating to the input/output is set in advance, and the upper limit electric powers can be changed according to, for example, the battery temperature Tb and the SOC of the battery pack 10. When the input/output is limited in the processing in Step S306, the previously-set upper limit electric power is declined. When the input/output is not limited in the processing in Step S307, a previously-set value is used as the upper limit electric power corresponding to the input/output.

A second embodiment will be described. In the first embodiment described above, the battery temperature Tb_igon that is available immediately after the ignition switch is turned ON is detected and the rest temperature Tb_rest depending on the environmental temperature of the vehicle is estimated. However, a deviation or a variation occurs in each battery temperature Tb_igon that is available immediately after the ignition switch is turned ON depending on a timing when the ignition switch is turned ON by a user. In other words, dependence on the timing (regularity)

when the ignition switch is turned ON by the user occurs when the rest temperature Tb_rest is estimated simply based on the battery temperature Tb_igon that is available immediately after the ignition switch is turned ON.

Figure 6:
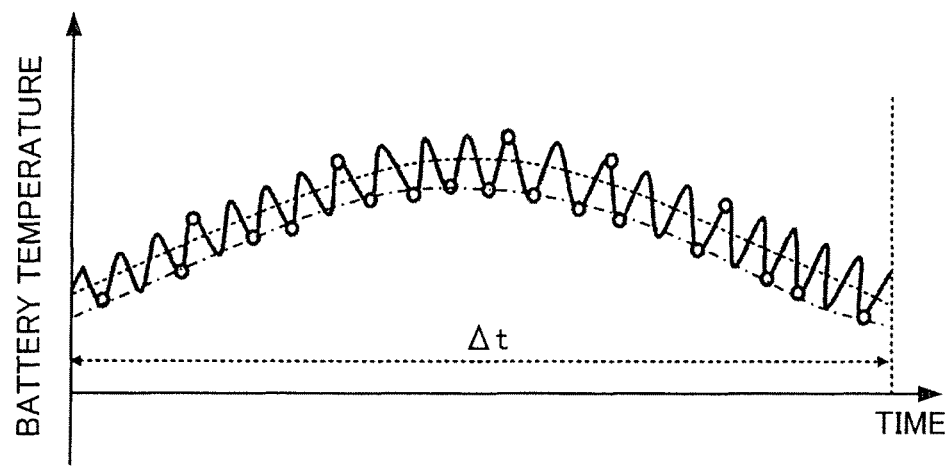
FIG. 6 is a diagram illustrating an example of a battery temperature transition and a battery temperature detection timing for rest temperature estimation at a time when an ignition switch is OFF according to a second embodiment.
Figure 7:
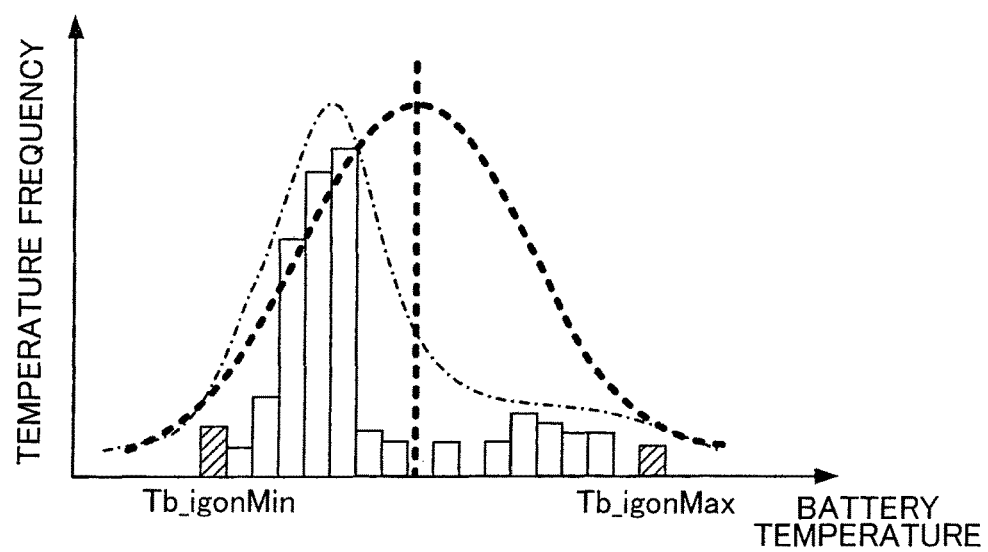
FIG. 7 is a diagram illustrating a temperature frequency distribution at a time when the ignition switch is OFF according to the second embodiment.

FIG. 6 is a diagram illustrating an example of a battery temperature transition during the rest and a detection timing for the battery temperature Tb_igon that is available immediately after the ignition switch is turned ON. The white circles in the example of FIG. 6 represent the timings when the ignition switch is turned ON (detection timings for the battery temperatures Tb_igon). FIG. 7 is a diagram illustrating a temperature frequency distribution of the battery temperature Tb_igon that is detected at each of the detection timings in FIG. 6.

In the case of a user who, for example, turns ON the ignition switch mainly early in the morning, the battery temperature Tb_igon is subject to a transition to a low temperature side from the actual change of the battery temperature Tb which is illustrated by the solid line in FIG. 6. As illustrated by the one-dot chain line in FIG. 7, the temperature frequency distribution of the battery temperature Tb_igon is lopsided to the low temperature side. In other words, in the example of FIG. 6, the battery temperature Tb_igon is detected to be lopsided to the low temperature side without exception in the case of the user who regularly turns ON the ignition switch in early-morning time slots in the change in the battery temperature Tb of the battery pack 10 depending on the actual environmental temperature.

However, for example, the ignition switch may be turned ON by day, when the outside air temperature is higher than early in the morning, as illustrated in FIG. 6. In this case, the ignition switch is turned ON more frequently early in the morning than the ignition switch is turned ON by day. Accordingly, the battery temperature Tb_igon that is available immediately after the ignition switch is turned ON by day is less likely to be reflected to the temperature distribution illustrated in FIG. 7 in a population frequently turning ON the ignition switch early in the morning. Accordingly, a divergence (difference) from the change in the actual battery temperature during the rest occurs. The temperature distributions illustrated by the one-dot chain lines in FIGS. 6 and 7 correspond to the first embodiment.

However, in rest temperature estimation according to this embodiment, a two-temperature average value of a first temperature which is regarded as a maximum value among the battery temperatures Tb_igon detected during the predetermined period Δt and a second temperature which is regarded as a minimum value among the battery temperatures Tb_igon detected during the predetermined period Δt is used, instead of the entire temperature distribution of the plurality of battery temperatures Tb_igon which are detected during the predetermined period Δt, in estimating the rest temperature Tb_rest so as to suppress the difference attributable to the dependence on the timing when the ignition switch is turned ON by the user, that is, the regularity with which the ignition switch is turned ON.

The first temperature that is regarded as the maximum value among the plurality of respective battery temperatures Tb_igon which are detected during the predetermined period is, for example, a temperature that is positioned on one end portion side in the distribution of the plurality of respective battery temperatures Tb_igon (for example, the distribution of the battery temperatures on the horizontal axis in the example of FIG. 7) available after the ignition switch is turned ON which are detected during the predetermined period. The second temperature that is regarded as the minimum value is a temperature that is positioned on the other end portion side in the distribution of the plurality of respective battery temperatures Tb_igon.

In this embodiment, the temperature frequency that is illustrated by the vertical axis in FIG. 7 is not allowed for and only the distribution of the battery temperatures on the horizontal axis is allowed for in the population of the plurality of respective battery temperatures Tb_igon available when the ignition switch is turned ON which are detected during the predetermined period in apprehending the first temperature which is positioned on the one end portion side of the battery temperature distribution width and regarded as the maximum value and the second temperature which is positioned on the other end portion side of the battery temperature distribution width and regarded as the minimum value.

Specifically, the maximum battery temperature Tb_igonMax and the minimum battery temperature Tb_igonMin can be used as the first temperature and the second temperature in the population of the plurality of respective battery temperatures Tb_igon which are detected during the predetermined period, and the two-temperature average value based on the maximum battery temperature Tb_igonMax and the minimum battery temperature Tb_igonMin can be the representative battery temperature Tb_ave for the predetermined period Δt.

The battery temperatures that are positioned at both ends in the temperature frequency distribution of FIG. 7 correspond to Tb_igonMax, Tb_igonMin. Then, the rest temperature to which the battery temperature Tb_igon available immediately after the ignition switch is turned ON by day is reflected can be estimated by using the representative battery temperature Tb_ave for the predetermined period Δt (rest temperature transition illustrated by the dotted line in FIG. 6) even in the case of high regularity in the same time slot in the timing when the ignition switch is turned ON by the user with respect to the actual change in the battery temperature Tb of the battery pack 10.

Next, a processing for estimating the rest temperature of the battery pack 10 will be described with reference to the flowchart that is illustrated in FIG. 8. The processing that is illustrated in FIG. 8 is executed by the controller 30. Steps S101 to S104, S107, S108 are identical to those illustrated in FIG. 3 for the first embodiment, and thus the same reference numerals will be attached with redundant description omitted while major differences will be described in detail below.

In Step S1101, the controller 30 determines whether or not the battery temperature Tb_igon that is stored in Step S104 is the maximum battery temperature Tb_igonMax of the battery temperatures Tb_igon which are detected during the predetermined period Δt. For example, the controller 30 compares the maximum battery temperature Tb_igonMax of the battery temperatures that are stored in advance on the memory 31 to the battery temperature Tb_igon which is stored in Step S104 and updates the maximum battery temperature Tb_igonMax to the battery temperature Tb_igon stored in Step S104 if the battery temperature Tb_igon is larger (S1102).

In a case where the battery temperature Tb_igon that is stored in Step S104 is determined to be smaller than the maximum battery temperature Tb_igonMax of the battery temperatures Tb_igon which are detected during the predetermined period Δt in Step S1101, the controller 30 allows the processing to proceed to Step S1103. In Step S1103, it is determined whether or not the battery temperature Tb_igon that is stored in Step S104 is the minimum battery temperature Tb_igonMin of the battery temperatures Tb_igon which are detected during the predetermined period Δt. For example, the controller 30 compares the minimum battery temperature Tb_igonMin of the battery temperatures that are stored in advance on the memory 31 to the battery temperature Tb_igon which is stored in Step S104 and updates the minimum battery temperature Tb_igonMin to the battery temperature Tb_igon stored in Step S104 if the battery temperature Tb_igon is smaller (S1104).

In a case where the battery temperature Tb_igon that is stored in Step S104 is smaller than the maximum battery temperature Tb_igonMax and larger than the minimum battery temperature Tb_igonMin in Steps S1101 to 1104, storing on the memory 31 may be performed without performing the update processing in Steps S1102, S1104 or discarding may be performed without storing on the memory 31 as the temperature frequency information for the predetermined period Δt.

Also, the battery temperature Tb_igon can be updated as it is as the maximum battery temperature Tb_igonMax and the minimum battery temperature Tb_igonMin in an initial state where the battery temperature Tb_igon is not stored on the memory 31 and in a case where the battery temperature Tb_igon is detected for the first time during the subsequent predetermined period Δt (described later) after the elapse of the predetermined period Δt.

Then, the controller 30 determines in Step S105, based on the time measurement by the timer 32, whether or not the elapsed time to the present exceeds the previously-set predetermined period Δt for sampling of the battery temperature Tb_igon which is available immediately after the ignition switch is turned ON. In this embodiment, a plurality of the battery temperatures Tb_igon are sampled for a certain period as in the first embodiment described above. The rest temperature of the battery pack 10 is updated (estimated) at a point of time when a certain amount and number of samples are accumulated.

In a case where it is determined that the predetermined period Δt has elapsed in Step S106, the controller 30 calculates the representative battery temperature Tb_ave based only on the maximum battery temperature Tb_igonMax and the minimum battery temperature Tb_igonMin of the respective battery temperatures Tb_igon which are detected during the predetermined period Δt. As described above, the average value of the maximum battery temperature Tb_igonMax and the minimum battery temperature Tb_igonMin is calculated as the representative battery temperature Tb_ave for the predetermined period Δt.

In Step S107, the controller 30 updates the rest temperature Tb_rest of the battery pack 10 by using the representative battery temperature Tb_ave for the predetermined period Δt calculated in Step S106. The updated rest temperature Tb_rest is stored on the memory 31 and is used in estimating the degradation amount of the battery pack 10 at a time when the ignition switch is OFF which is illustrated in FIG. 4 for the first embodiment.

The controller 30 calculates and updates the rest temperature Tb_rest of the battery pack 10 for each predetermined period Δt. In this case, the rest temperature Tb_rest that is estimated in any predetermined period Δt is estimated independently of the subsequent predetermined period Δt.

The controller 30 partitions the continuous period of use of the battery pack 10 (vehicle) into the predetermined period Δt and performs processing for detecting the battery temperature Tb_igon and processing for extracting the maximum battery temperature Tb_igonMax and the minimum battery temperature Tb_igonMin independently in each of the predetermined period Δt. Accordingly, in Step S1105, the controller 30 calculates the rest temperature Tb_rest for the present predetermined period Δt and then initiates a processing for counting the elapsed time for the subsequent predetermined period (determination period) Δt and performs processing for initializing (resetting) the maximum battery temperature Tb_igonMax and the minimum battery temperature Tb_igonMin. For example, any initial values can be set for the maximum battery temperature Tb_igonMax and the minimum battery temperature Tb_igonMin.

As described above, the rest temperature Tb_rest that is estimated in the present predetermined period Δt does not depend on the rest temperature Tb_rest that is estimated in the previous predetermined period Δt (the maximum battery temperature Tb_igonMax and the minimum battery temperature Tb_igonMin for the previous predetermined period Δt) in this embodiment, and the maximum battery temperature Tb_igonMax and the minimum battery temperature Tb_igonMin are initialized every time when the rest temperature Tb_rest is calculated. The battery temperatures Tb_igon that are detected for the subsequent predetermined period Δt are used to specify the maximum battery temperature Tb_igonMax and the minimum battery temperature Tb_igonMin of the plurality of battery temperatures Tb_igon which are detected in the predetermined period Δt, and the rest temperature Tb_rest of the battery pack 10 is estimated for each predetermined period Δt.

FIG. 9 is a diagram illustrating a change in the rest temperature Tb_rest that occurs in a case where the environment of the vehicle is changed. The one-dot chain line in the example of FIG. 9 represents a transition of the battery temperature Tb at a time of actual ignition switch OFF, and the solid line in the example of FIG. 9 represents the rest temperature Tb_rest which is estimated for each predetermined period Δt. This is the same for FIG. 10.

As illustrated in FIG. 9, the controller 30 estimates the rest temperature Tb_rest for each predetermined period Δt. The plurality of battery temperatures Tb_igon that are sampled in the predetermined period Δt (A) is used as the latest rest temperatures Tb_rest in the subsequent predetermined period Δt (B). In this case, the rest temperature Tb_rest that is estimated based on the battery temperature Tb_igon sampled in the predetermined period Δt (B) is used as the latest rest temperature Tb_rest in the predetermined period Δt (C) following the predetermined period Δt (B) in this embodiment in a case where, for example, the vehicle use environment is changed from a low temperature region to a high temperature region from the middle of the predetermined period Δt (B).

The temperature frequency distribution allows for the battery temperature Tb_igon in the low temperature region, as illustrated in FIG. 7, and the rest temperature Tb_rest is affected by the low temperature region regardless of the change in the use environment to the high temperature region in the related art in a case where the vehicle use environment is changed from the middle of the predetermined period Δt that is the determination period for the rest temperature Tb_rest as described above. However, in this embodiment, the rest temperature Tb_rest is calculated from the maximum battery temperature Tb_igonMax and the minimum battery temperature Tb_igonMin for the predetermined period Δt (B), and thus dependence on the battery temperature Tb_igon in the low temperature region prior to the change in the use environment to the high temperature region can be suppressed and the rest temperature Tb_rest corresponding to the high temperature region after the change in the use environment can be accurately estimated.

FIG. 10 is a diagram illustrating a change in the rest temperature Tb_rest that occurs in a case where the environment of the vehicle is temporarily changed. In a case where, for example, the user using the vehicle in the low temperature region temporarily visits and uses the vehicle in the high temperature region in the predetermined period Δt (B), the battery temperature Tb_igon that is sampled during the predetermined period Δt (B) temporarily increases. Accordingly, the temporarily increased battery temperature Tb_igon among the battery temperatures Tb_igon which are sampled in the predetermined period Δt (B) is reflected to the maximum battery temperature Tb_igonMax. Accordingly, the latest rest temperature Tb_rest in the predetermined period Δt (C) is estimated to be higher than the rest temperature Tb_rest for the predetermined period Δt (B).

The temporarily increased battery temperature is reflected, as illustrated in FIG. 7, in this case in the related art, and thus the rest temperature Tb_rest is affected even in the predetermined period Δt (D) following the predetermined period Δt (C) regardless of the temporary change in the use environment. However, in this embodiment, the latest rest temperature Tb_rest for the subsequent predetermined period Δt (D) does not relate to the latest rest temperature Tb_rest for the predetermined period Δt (C) (battery temperature Tb_igon sampled in the predetermined period Δt (B)), although the latest rest temperature Tb_rest for the predetermined period Δt (C) is temporarily increased, and is calculated from the maximum battery temperature Tb_igonMax and the minimum battery temperature Tb_igonMin for the predetermined period Δt (C). Accordingly, even if the latest rest temperature Tb_rest for the predetermined period Δt (C) is temporarily increased, the latest rest temperature Tb_rest for the subsequent predetermined period Δt (D) is decreased according to the use environment of the user (predetermined period Δt (C) corresponding to the use environment of the user with no temporary change), and the dependence on the battery temperature Tb_igon can be suppressed even when the use environment is temporarily changed and the rest temperature Tb_rest can be accurately estimated.

In the above description, the two-temperature average value of the maximum battery temperature Tb_igonMax, which is the highest one of the plurality of battery temperatures Tb_igon that are sampled during the predetermined period Δt, and the minimum battery temperature Tb_igonMin, which is the lowest one of the plurality of battery temperatures Tb_igon that are sampled during the predetermined period Δt, is used in estimating the rest temperature Tb_rest. However, the invention is not limited thereto. For example, a two-temperature average of a second-highest battery temperature Tb_igonMax2 and a second-lowest battery temperature Tb_igonMin2 can also be used in estimating the rest temperature Tb_rest.

In other words, the second-highest battery temperature Tb_igonMax2 of the temperatures that are positioned on the one end portion side of the distribution of the plurality of respective battery temperatures Tb_igon available at a time when the ignition switch is turned ON which are detected for the above-described predetermined period Δt is the first temperature regarded as the maximum value and the second-lowest battery temperature Tb_igonMin2 of the temperatures that are positioned on the other end portion side of the distribution is the second temperature regarded as the minimum value in estimating the rest temperature Tb_rest based on the average value.

The highest maximum battery temperature Tb_igonMax and the lowest minimum battery temperature Tb_igonMin, for example, may be signals in which noise or the like is temporarily included in detection signals of the temperature sensor 23. In this case, the rest temperature Tb_rest may be estimated with a significant divergence from the use environment of the user due to the noise. In the processing that is illustrated in FIG. 8, the second-highest battery temperature Tb_igonMax2 can be configured to be updated when the highest battery temperature Tb_igonMax is updated and the second-lowest battery temperature Tb_igonMin2 can be configured to be updated when the lowest minimum battery temperature Tb_igonMin is updated.

It is determined in advance whether to estimate the rest temperature Tb_rest by using the highest maximum battery temperature Tb_igonMax and the lowest minimum battery temperature Tb_igonMin in advance or to estimate the rest temperature Tb_rest by using the second-highest battery temperature Tb_igonMax2 and the second-lowest battery temperature Tb_igonMin2. In a case where the rest temperature Tb_rest is set to be estimated by using the second-highest battery temperature Tb_igonMax2 and the second-lowest battery temperature Tb_igonMin2, the controller 30 estimates the rest temperature Tb_rest by using the battery temperature Tb_igonMax2 and the battery temperature Tb_igonMin2 without using the highest maximum battery temperature Tb_igonMax and the lowest minimum battery temperature Tb_igonMin.

According to this configuration, the rest temperature is estimated based on the average value of the second-highest battery temperature Tb_igonMax2 and the second-lowest battery temperature Tb_igonMin2 for the predetermined period Δt and the noise included in the respective temperatures detected when the ignition switch is turned ON which are detected during the predetermined period Δt can be suppressed even if the highest maximum battery temperature Tb_igonMax and the lowest minimum battery temperature Tb_igonMin for the predetermined period Δt significantly diverge from the use environment of the user by being affected by the noise.

In the above description, not only the maximum battery temperature Tb_igonMax and the minimum battery temperature Tb_igonMin but also the battery temperatures Tb_igon that is available immediately after the ignition switch is turned ON are stored on the memory 31, and thus the controller 30 may also be configured to generate the temperature frequency distribution as illustrated in the example of FIG. 7 by using these battery temperatures Tb_igon. Even in this case, the rest temperature Tb_rest according to this embodiment is estimated by using the maximum battery temperature Tb_igonMax/minimum battery temperature Tb_igonMin at the ends of the temperature frequency distribution as illustrated in the example of FIG. 7 without being affected by the entire temperature frequency distribution.

Even in the first embodiment, the rest temperature Tb_rest that is estimated for the predetermined period Δt can be configured to be estimated independently of the preceding and subsequent predetermined period Δt as illustrated in FIGS. 9 and 10.

In this case, the controller 30 can perform the step in Step S1105 in FIG. 8 after the Step S107 that is illustrated in FIG. 3, and can initiate the processing for counting the elapsed time for the subsequent predetermined period (determination period) Δt and perform the processing for initializing (resetting) the battery temperature Tb_igon used in the present predetermined period Δt after calculating the rest temperature Tb_rest for the present predetermined period Δt.

The first and second embodiments can also be configured for the processing in Step S108 that is illustrated in FIGS. 3 and 8 not to be performed. For example, a configuration in which an independent processing for estimating the rest temperature for the long rest period depending on the environmental temperature of the vehicle is executed is also possible so that the processing for estimating the rest temperature for the short rest period is separately performed. Also, a configuration in which the rest temperature for the long rest period is estimated without performing the processing for estimating the rest temperature for the short rest period is possible.

In addition, the processing for estimating the rest temperature that is illustrated in the second embodiment does not have to presume the processing for estimating the rest temperature of the first embodiment. In other words, a configuration for the processing for estimating the rest temperature in which a median value (average value) of the first temperature regarded as the maximum value and the second temperature regarded as the minimum value targeting the population is the representative battery temperature Tb_ave for the predetermined period Δt is possible not to use the average values of all or some of the populations of the plurality of respective battery temperatures Tb_igon available at a time when the ignition switch is ON which are detected for the predetermined period.

The invention claimed is:

1. An electric power storage system for a vehicle, the vehicle including an ignition switch, the electric power storage system comprising:
   an electric power storage device that is mounted on the vehicle;
   a temperature sensor configured to detect a temperature of the electric power storage device; and
   a controller configured to
      acquire the temperature of the electric power storage device at a time when the ignition switch is turned ON by using the temperature sensor when the ignition switch is turned ON, and
         estimate a rest temperature by using an average value of at least two of a plurality of the temperatures acquired during a predetermined period, the rest temperature being a temperature of the electric power storage device at a time when the ignition switch is OFF, and the plurality of the temperatures being the temperatures of the electric power storage device acquired at a time when the ignition switch is turned ON during the predetermined period,
   wherein the controller is configured to acquire the temperature of the electric power storage device at a time when the ignition switch is turned ON by using the temperature sensor every time the ignition switch is turned ON, and
   wherein the controller is configured to estimate the rest temperature by using an average value of a first temperature and a second temperature, the first temperature is a temperature regarded as a maximum value of the plurality of the temperatures and the second temperature is a temperature regarded as a minimum value of the plurality of the temperatures
   wherein the controller is configured to estimate the rest temperature such that the rest temperature reflects a change in an environmental temperature during a rest of the vehicle.

2. The electric power storage system according to claim 1, wherein a first temperature is a highest temperature of the plurality of the temperatures and a second temperature is a lowest temperature of the plurality of the temperatures.

3. The electric power storage system according to claim 1, wherein a first temperature is a second-highest temperature of the plurality of the temperatures and a second temperature is a second-lowest temperature of the plurality of the temperatures.

4. The electric power storage system according to claim 1, wherein the controller is configured to
   determine whether or not an elapsed time continuing until the ignition switch is turned ON from a moment at which the ignition switch is turned OFF is longer than a predetermined time, and
   acquire the temperature of the electric power storage device at a time when the ignition switch is turned ON during the predetermined period when the elapsed time is longer than the predetermined time.

5. The electric power storage system according to claim 1, wherein the controller is configured to estimate the rest temperature for each of the predetermined period by initializing the plurality of the temperatures when the predetermined period elapses.

6. The electric power storage system according to claim 1, wherein the controller is configured to estimate the rest temperature for each of the predetermined period by initializing the plurality of the temperatures every time the predetermined period elapses.

7. The electric power storage system according to claim 1, wherein the controller is configured to calculate a degradation state corresponding to the estimated rest temperature using a correspondence relation between the degradation state of the electric power storage device and the rest temperature.

8. An electric power storage system for a vehicle, the vehicle including an ignition switch, the electric power storage system comprising:
   an electric power storage device that is mounted on the vehicle;
   a temperature sensor configured to detect and output a temperature of the electric power storage device; and
   a controller configured to
      acquire and accumulate the temperature of the electric power storage device with the temperature sensor when the ignition switch is turned ON during a predetermined period,
      calculate an average value of the temperatures of the electric power storage device accumulated during the predetermined period, and
      set the average value as a rest temperature, the rest temperature being the temperature of the electric power storage device available when the ignition switch is OFF,
   wherein the controller is configured to acquire and accumulate the temperature of the electric power storage device at a time when the ignition switch is turned ON by using the temperature sensor every time the ignition switch is turned ON, and
   wherein the controller is configured to estimate the rest temperature by using an average value of a first temperature and a second temperature, the first temperature is a temperature regarded as a maximum value of the plurality of the temperatures and the second temperature is a temperature regarded as a minimum value of the plurality of the temperatures, wherein the controller is configured to estimate the rest temperature such that the rest temperature reflects a change in an environmental temperature during a rest of the vehicle.

9. A method for controlling an electric power storage system for a vehicle, the vehicle including an ignition switch, the electric power storage system including an electric power storage device, a temperature sensor, and a controller, the electric power storage device being mounted on the vehicle, and the temperature sensor being configured to detect and output a temperature of the electric power storage device, the method comprising:

acquiring, using the temperature sensor, the temperature of the electric power storage device when the ignition switch is turned ON during a predetermined period;

accumulating, by the controller, the temperature of the electric power storage device when the ignition switch is turned ON;

calculating, by the controller, an average value of the temperature of the electric power storage device accumulated during the predetermined period; and setting, by the controller, the average value as a rest temperature, the rest temperature being the temperature of the electric power storage device available when the ignition switch is OFF, wherein the temperature of the electric power storage device is acquired, using the temperature sensor, every time the ignition switch is turned ON during the predetermined period, and the temperature of the electric power storage device is accumulated, by the controller, every time the ignition switch is turned ON, and wherein the controller is configured to estimated the rest temperature by using an average value of a first temperature and a second temperature, the first temperature is a temperature regarded as a maximum value of the plurality of the temperatures and the second temperature is a temperature regarded as a minimum value of the plurality of the temperatures, wherein the controller is configured to estimate the rest temperature such that the rest temperature reflects a change in an environmental temperature during a rest of the vehicle.

* * * * *